(12) United States Patent
Vo

(10) Patent No.: US 7,960,814 B2
(45) Date of Patent: Jun. 14, 2011

(54) STRESS RELIEF OF A SEMICONDUCTOR DEVICE

(75) Inventor: Nhat Dinh Vo, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 65 days.

(21) Appl. No.: 11/835,680

(22) Filed: Aug. 8, 2007

(65) Prior Publication Data
US 2009/0039470 A1 Feb. 12, 2009

(51) Int. Cl.
*H01L 23/544* (2006.01)
(52) U.S. Cl. .................... 257/620; 438/462
(58) Field of Classification Search .............. 257/420, 257/462, 620; 438/462
See application file for complete search history.

(56) References Cited

U.S. PATENT DOCUMENTS

| | | | |
|---|---|---|---|
| 4,922,326 A | 5/1990 | Blumenshine et al. | |
| 4,976,814 A | 12/1990 | Blumenshine et al. | |
| 5,858,882 A | 1/1999 | Chang et al. | |
| 6,709,954 B1 | 3/2004 | Werking | |
| 6,759,272 B2 | 7/2004 | Tsubosaki et al. | |
| 7,129,566 B2 * | 10/2006 | Uehling et al. | 257/620 |
| 7,223,673 B2 | 5/2007 | Wang et al. | |
| 2004/0101663 A1 | 5/2004 | Agarwala et al. | |
| 2004/0129938 A1 | 7/2004 | Landers et al. | |
| 2004/0207078 A1 | 10/2004 | Su et al. | |
| 2005/0026397 A1 | 2/2005 | Daubenspeck et al. | |
| 2005/0280152 A1 | 12/2005 | Fitzsimmons et al. | |
| 2006/0073676 A1 * | 4/2006 | Chen et al. | 438/460 |

OTHER PUBLICATIONS

Lee, et al., filed as PCT/EP2006/002851 filed on Feb. 3, 2006.
PCT/US2008/068023 International Search Report and Written Opinion mailed Sep. 30, 2008.
U.S. Appl. No. 11/252,409 filed Oct. 18, 2005.

* cited by examiner

*Primary Examiner* — Steven Loke
*Assistant Examiner* — Kimberly M Thomas
(74) *Attorney, Agent, or Firm* — Kim-Marie Vo; Ranjeev Singh

(57) ABSTRACT

A semiconductor device includes a die including an active region, a scribe region, and a perimeter, wherein the scribe region is closer to the perimeter than the active region. In one embodiment, the die further comprises a crack arrest structure formed in the scribe region, and wherein the crack arrest structure includes one of curva-linear shapes and polygonal shapes concentrically oriented around a common center located at or near at least one corner of the die.

8 Claims, 4 Drawing Sheets

STRESS RELIEF OF A SEMICONDUCTOR DEVICE

BACKGROUND

1. Field

This disclosure relates generally to semiconductor devices, and more specifically, to stress relief of semiconductor devices.

2. Related Art

During manufacturing and in the application environment, stress is induced in semiconductor devices. The stress, for example, may occur because the mold encapsulant has material properties different than that of other layers in the semiconductor device. Cracks initiate and propagate within the semiconductor device to relieve the stress. The cracks are also known as delamination or separation. The delamination may result in electrical failures or loss of functionality.

To improve the performance of semiconductor devices, low dielectric constant materials are used for interlayer dielectric (ILD) layers. However, low dielectric constant materials have a greater propensity to delaminate. Therefore, a need exists to minimize or prevent delamination, especially when a low dielectric constant material is used for ILD layers.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Cracks usually initiate near the edge or corners of die, propagate in towards the active circuit area, and destroy the functionality of the device. To increase yield, it is desirable to prevent the initiation and propagation of these stress-reducing cracks. Crack arrest structure can be used to either prevent delamination near the die edge or to prevent the delamination from entering an active circuit area. In one embodiment, the crack arrest structure includes curva-linear or (multi-edge) polygon crack features. In one embodiment, the crack arrest features include metal structures, which include vias, and are formed in all metal layers of the semiconductor device (i.e., from the top most metal layer down to the first metal layer) in the high-stress problem areas of the die. In one embodiment, the metal structures are stacked in a step or stair-step pattern to divert crack propagation from the active circuit area. In one embodiment, the presence of crack arrest structures reduces stress concentration and impedes delamination in the x-y plane. If the metal structures are stair-stepped, the structures can desirably direct delamination propagation in the z-plane, where the z-plane is perpendicular to the substrate of the semiconductor device.

Figure 1:
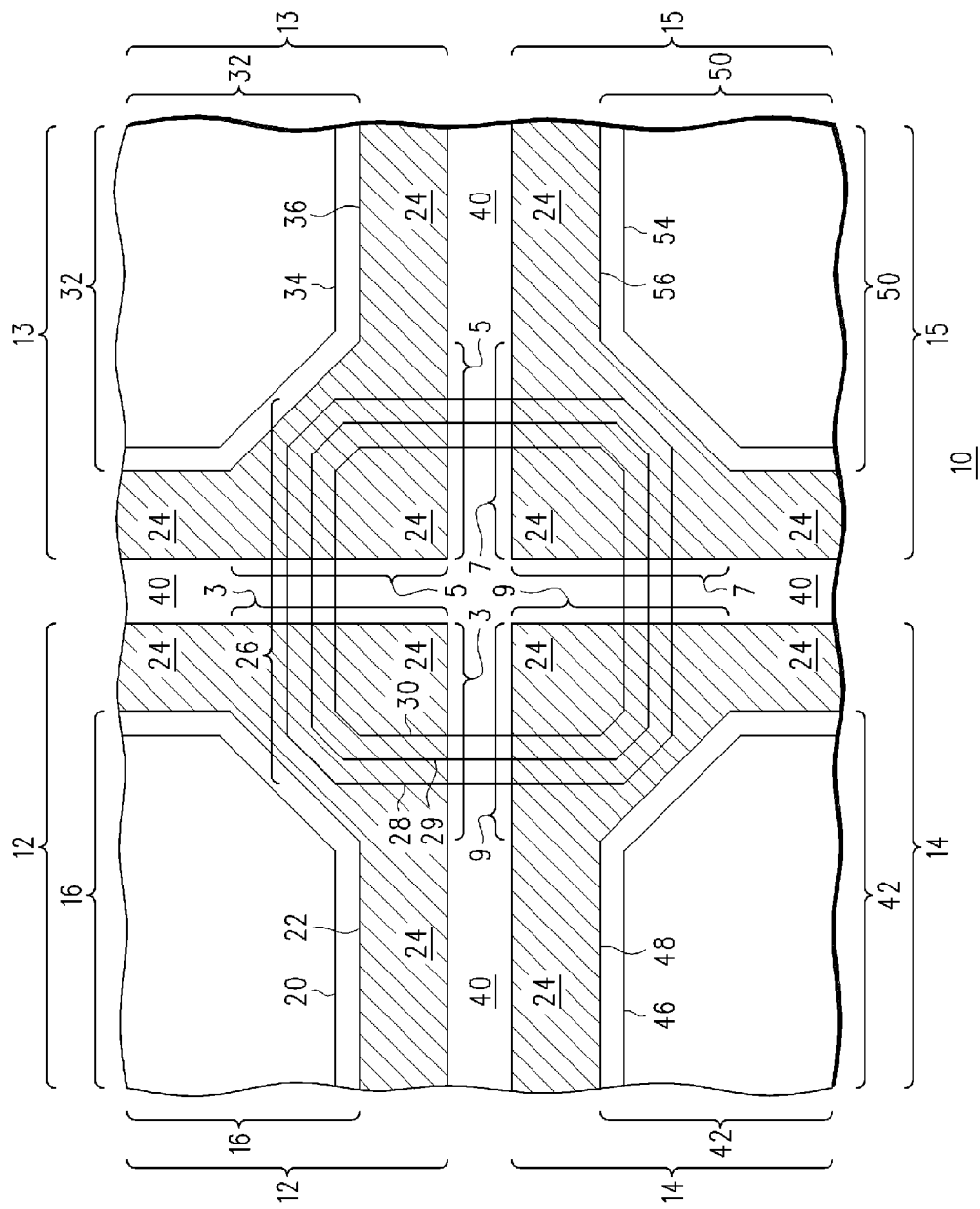
FIG. 1 illustrates a top down view of a workpiece in accordance with an embodiment.

FIG. 1 illustrates a top down view of a workpiece or (semi-conductor) wafer 10 in accordance with an embodiment. Four die—a first die 12, a second die 13, a third die 14, and a fourth die 15—are illustrated on the wafer 10 and each includes a perimeter. A skilled artisan appreciates that any number of die can be present on the wafer 10. The die 12-15 are separated from each other by a scribe region 24 and a saw region 40. The saw region 40 is the area where a saw or other apparatus will be used to singulate the die 12-15 from each other during subsequent processing.

A scribe region can include a saw region. Hence, the scribe region could be defined as the scribe region 24 as illustrated and the saw region 40 and the saw region 40 can be anywhere within the scribe region 24. However, for ease of understanding the scribe region 24, herein, is distinguished from the saw region 40 and thus, does not include the saw region 40.

The first die 12 includes an active region 16 and the scribe region 24. The active region 16 includes active circuitry (not shown) known to a skilled artisan. In contrast, the scribe region 24 does not include active circuitry. Hence, any circuitry or features in the scribe region are not used directly for the die's electrical performance, but may not be used for electrical test or other uses. For example, if the first die 12 is a microprocessor none of the circuitry used for the microprocessing functions lies in the scribe region 24. In one embodiment, a crack stop 22 delineates the active region 16 from the scribe region 24. In one embodiment, the active region 16 includes an edge seal 20. In another embodiment, the edge seal 20 is part of the active region and at least partially surrounds the active region 16. In one embodiment, the crack stop 22 at least partially surrounds the active region 16. In one embodiment, the edge seal 20 is a moisture and crack barrier and the crack stop 22 is a crack barrier. However, the edge seal 20 and the crack stop 22 do not sufficiently stop cracks, especially those created when a low dielectric constant material is used for an ILD layer.

The first die 12 includes a corner region 3 and a non-corner region. The corner region is a portion of the scribe region 24 that is near a corner of the first die 12. In the embodiment illustrated in FIG. 1, a portion of the corner region 3 is defined by the crack stop 22. In another embodiment, the crack stop 22 does not define a boundary of the corner region 3. In one embodiment, the first die 12 is a square or rectangle, and hence, the first die 12 in this embodiment has four corner regions 3, although only one corner region 3 is illustrated. While most die are squares or rectangular and hence will have four corner regions, a die can have any number of corner regions. The portion(s) of the die that is (are) not the corner region(s) is (are) the non-corner regions.

The second die 13 includes an active region 32 and a scribe region 24. The active region 32 includes active circuitry (not shown) known to a skilled artisan. In contrast, the scribe region 24 does not include active circuitry. In one embodiment, a crack stop 36 delineates the active region 32 from the scribe region 24. In one embodiment, the active region 32 includes an edge seal 34. In another embodiment, the edge seal 34 is part of the active region and at least partially surrounds the active region 32. In one embodiment, the crack stop 36 at least partially surrounds the active region 32.

The second die includes a corner region 5 and non-corner regions. The corner region 5 is equivalent to the corner region 3. Hence, the corner region 5 is a portion of the scribe region 24. Similarly, the crack stop 36 may define a boundary of the corner region 5. The portions of the second die 13 that are not the corner regions 5 are the non-corner region(s).

The third die 14 includes an active region 42 and a scribe region 24. The active region 42 includes active circuitry (not shown) known to a skilled artisan. In contrast, the scribe region 24 does not include active circuitry. In one embodiment, a crack stop 48 delineates the active region 42 from the scribe region 24. In one embodiment, the active region 42 includes an edge seal 46. In another embodiment, the edge seal 46 is not part of the active region and at least partially surrounds the active region 42. In one embodiment, the crack stop 48 at least partially surrounds the active region 42. The third die 14 includes corner region(s) 9 and non-corner region (s). The corner region 9 is equivalent to the corner regions 3 and 5.

The fourth die 15 includes an active region 50 and the scribe region 24. The active region 50 includes active circuitry (not shown) known to a skilled artisan. In contrast, the scribe region 24 does not include active circuitry. In one embodiment, a crack stop 56 delineates the active region 50 from the scribe region 24. In one embodiment, the active region 50 includes an edge seal 54. In another embodiment, the edge seal 54 is not part of the active region and at least partially surrounds the active region 50. In one embodiment, the crack stop 56 at least partially surrounds the active region 50. The fourth die 15 includes corner region(s) 7 and non-corner region(s). The corner region 7 is equivalent to the corner regions 3, 5, and 9.

In the embodiment illustrated in FIG. 1, the crack stops 22, 36, 48, and 56 and edge seals 20, 34, 46, and 54 cut across the corner of the die 12-15 at approximately a 45-degree angle relative to the edge of the die 12-15. However, the crack stops 22, 36, 48, and 56 and edge seals 20, 34, 46, and 54 may be parallel to the edges of the dies 12-15 and have approximately 90-degree angles. Any other configuration of the crack stops 22, 36, 48, and 56 and edge seals 20, 34, 46, and 54 are also possible. In addition, the crack stops 22, 36, 48, and 56 or edge seals 20, 34, 46, and 54 may not be present.

In the embodiment illustrated in FIG. 1, a crack arrest or relief structure 26, bridges the scribe region(s) 24 and the saw region 40. Hence, the four die 12-15 include at least a portion of the crack arrest structure 26. Since a portion of the crack arrest structure 26 illustrated in FIG. 1 is within the saw region 40, a portion of the crack arrest structure 26 will be destroyed when the die 12-15 are singulated along the saw region 40.

As illustrated in FIG. 1, the crack arrest structure 26 is in the corner regions 3, 5, 7, and 9 of the die 12-15. Although not illustrated, the crack arrest structure 26 can be in more than one of the corner regions (e.g., all the corner regions) of the die 12-15. In the embodiment illustrated, the non-corner regions are devoid of the crack arrest structure 26. In other words, only at least one corner region 3, 5, 7, and 9 of each die 12-15 includes a crack arrest structure 26, which can be a portion thereof. As discussed above, crack arrest structure 26 will be divided into portions after the die 12-15 are singulated. These portions may be referred to as a crack arrest structure as opposed to only a portion of the crack arrest structure.

The crack arrest structure 26 includes crack arrest features 28, 29, and 30. In one embodiment, the crack arrest features 28, 29, and 30 are metal features or structures. In one embodiment, the crack arrest features 28, 29, and 30 are concentric from a top view. In one embodiment, each crack arrest feature is a (multi-edged) polygon. In the illustrated embodiment, each crack arrest feature is an eight-edged polygon; however, the polygon may have any number of edges. Each of the crack arrest features 28-30 that form the crack arrest structure 26 may not have the same number of edges as each other or be the same shape as one another. For example, one crack arrest feature may have eight edges and another may have twelve edges. Although three crack arrest features 28-30 are illustrated, the crack arrest structure 26 can include any number of crack arrest features.

Figure 2:
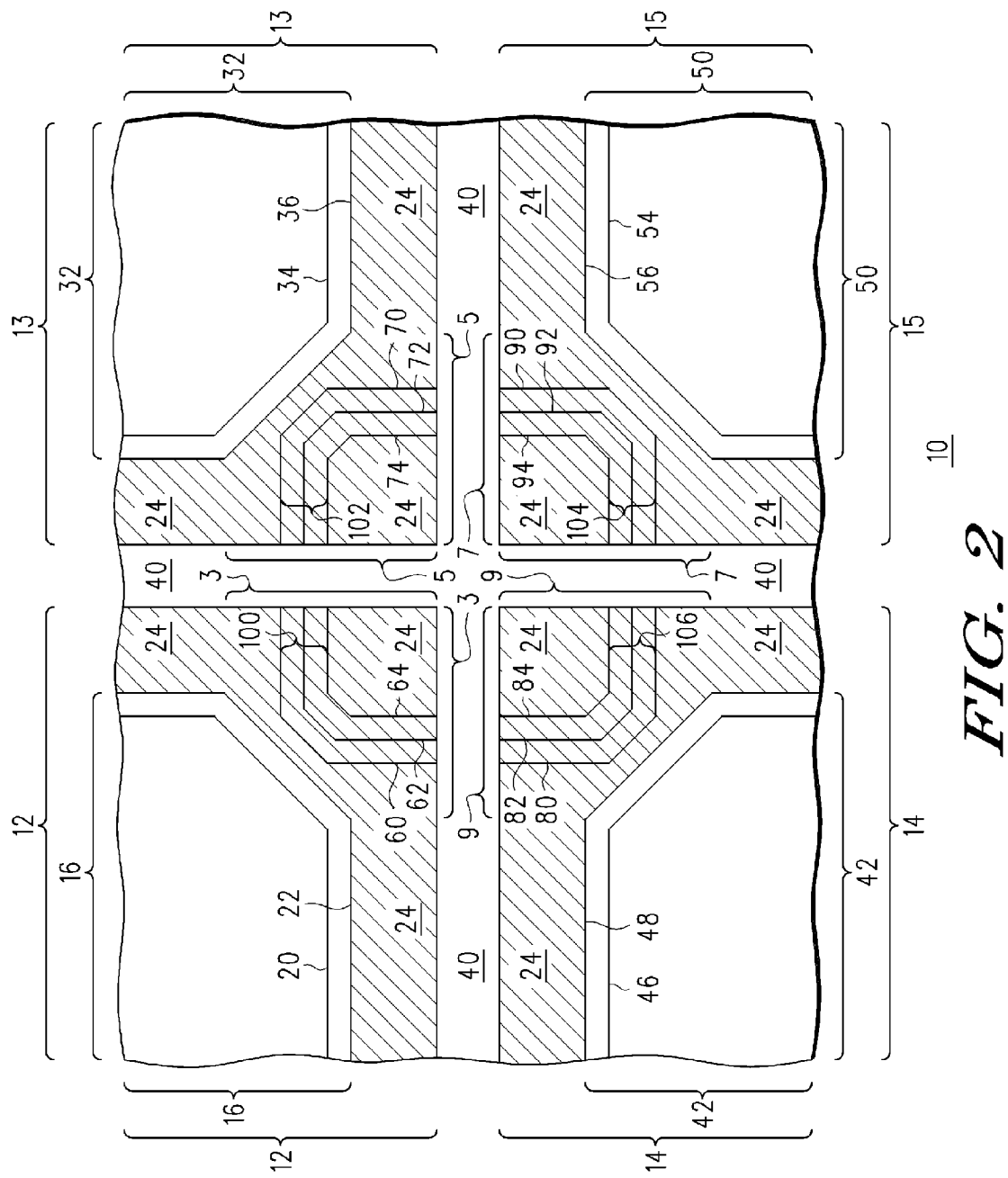
FIG. 2 illustrates a top down view of a workpiece in accordance with another embodiment.

FIG. 2 illustrates another embodiment of crack arrest features on the wafer 10. A skilled artisan recognizes that elements with the same element number in different figures are equivalent. The first die 12 includes a crack arrest structure 100 having crack arrest features 60, 62, and 64. The second die 13 includes a crack arrest structure 102 having crack arrest features 70, 72, and 74. The third die 14 includes a crack arrest structure 106 having crack arrest features 80, 82, and 84. The fourth die 15 includes a crack arrest structure 104 having crack arrest features 90, 92, and 94. Similar to the crack arrest structure 26 of FIG. 1, the crack arrest structures 100, 102, 104, and 106 are polygons. Unlike the crack arrest structure 26 in FIG. 1, no portion of a crack arrest structure 100, 102, 104, and 106 is within the saw region 40. Thus, in this embodiment, when the die 12-15 are singulated using a saw, for example, the saw will not destroy or cut through portions of a crack arrest structure. The absence of the crack arrest structure in the saw region 40 makes it easier to cut the die and decrease the risk of delamination of the ILD layer that can occur during singulation.

Figure 3:
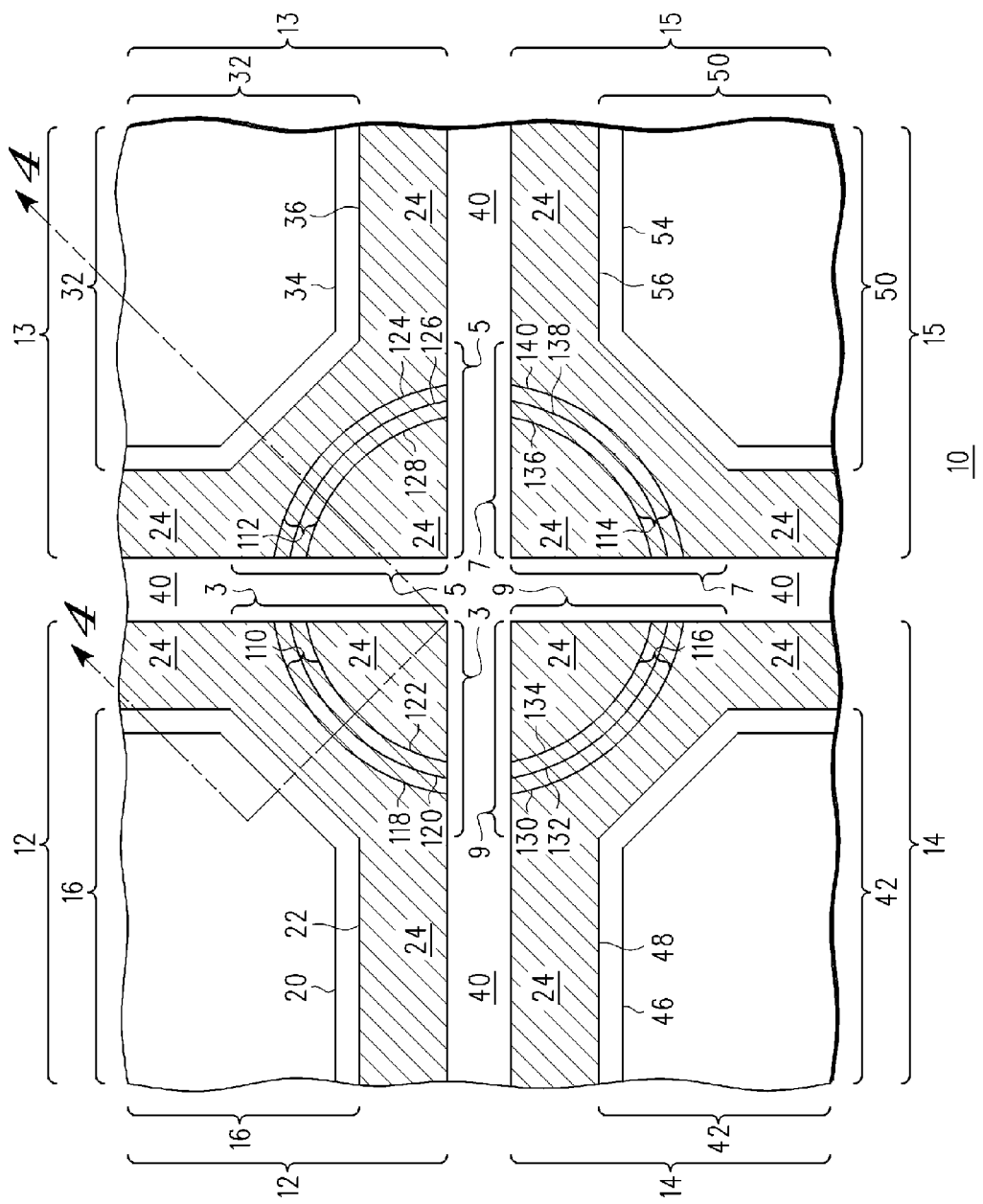
FIG. 3 illustrates a top down view of a workpiece in accordance with another embodiment.

FIG. 3 illustrates yet another embodiment of crack arrest features on the wafer 10. The first die 12 includes a crack arrest structure 110 having crack arrest features 118, 120, and 122. The second die 13 includes a crack arrest structure 112 having crack arrest features 124, 126, and 128. The third die 14 includes a crack arrest structure 116 having crack arrest features 130, 132, and 134. The fourth die 15 includes a crack arrest structure 114 having crack arrest features 136, 138, and 140. Similar to the crack arrest structures 100, 102, 104, and 106 of FIG. 2, the crack arrest structures 110, 112, 114, and 116 are not within the saw region 40. However, in one embodiment, the crack arrest structures 110, 112, 114, and 116 extend into the saw region 40 and form continuous crack arrest features. The crack arrest structures 110, 112, 114, and 116 are different than the crack arrest structures 26, 100, 102, 104, and 106 of FIGS. 1 and 2 because the crack arrest structures 110, 112, 114, and 116 are concentric circles. In one embodiment, the crack arrest features 28, 29, and 30 may be curva-linear shapes, such as circles, ovals, ellipses, a half-moon shape, the like, or potions thereof. In another embodiment, one crack arrest feature may be a polygon and another may be a curva-linear shape.

The crack arrest structure substantially or completely stops the initiation or propagation of a crack so that delamination does not occur between various layers (especially, between the low dielectric constant material and the metal layers) in the active regions. When the die is stressed, in one embodiment delamination occurs at the corner of the die and propagates in towards the center of the die in a radial fashion. (Hence, in this embodiment, any cracks that start at the corner of the die and propagate in towards the center of the die.) Thus, when delamination is viewed using scanning acoustic microscopy, it appears as a portion of a circle with the center of the circle being at or near the corner of the die. It is desirable for the crack arrest features to have a shape that is similar to the stress propagation profile. Thus, in one embodiment, the crack arrest features are concentric circles. If the crack arrest features are curva-linear in shape, the shape of the crack arrest features most closely matches the delamination propagation profile. Thus, the curve-liner shape more evenly distributes stress than other shapes, therefore decreasing delamination. Furthermore, the surface area of the crack arrest features is greater when the crack arrest features are curva-linear shapes than when they are polygon shaped. This increase in surface area increases the likelihood of preventing the encroachment of any crack or delamination past the crack arrest structure and into the active area of the die. However, due to processing limitations and difficulties, the crack arrest feature may not be able to be the same shape as the stress propagation profile, even if it is desired to be the same shape. For example, the crack arrest feature may be a polygon as opposed to a circle due to processing limitations of forming curved shapes.

As described above, the crack arrest structure may include concentric crack arrest features that are curva-linear or polygon shaped. In the embodiments illustrated in FIGS. 1-3, the crack arrest features extend concentrically around a common center that is located in the saw region, and more specifically in the center of the intersection of lines that form the saw region. In another embodiment, the crack arrest features may extend concentrically around a common center that is in a different location within the saw region or they may extend concentrically around a common center that is at a corner of the die. Furthermore, the crack arrest features may extend concentrically around a common center that is located on the die in a corner region. For example, the common center can be in the scribe region. In other words, the crack arrest features may extend concentrically around a common center that is located at or near (e.g., in the saw or scribe region) a corner of the die.

Figure 4:
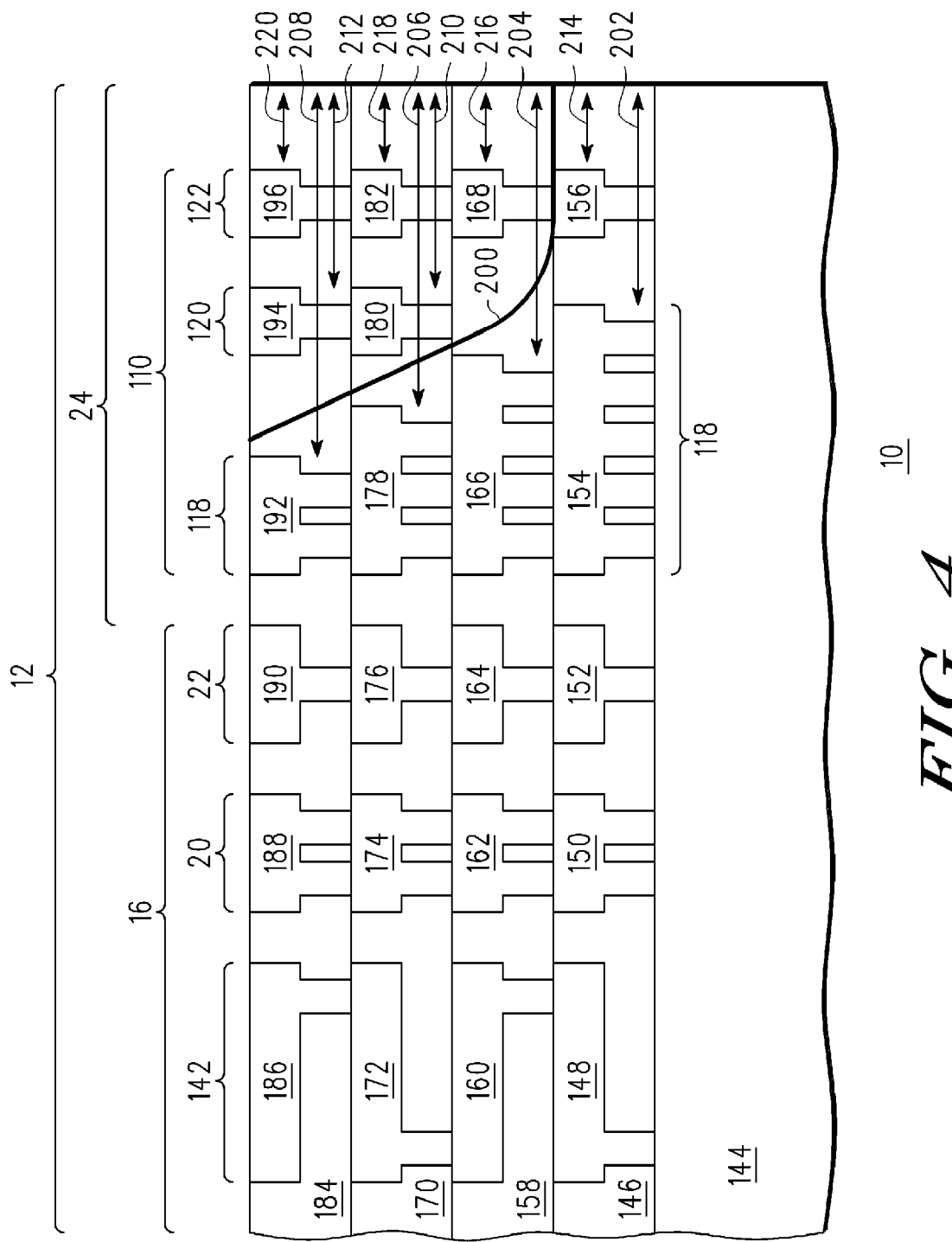
FIG. 4 illustrates a cross-sectional view of a portion of FIG. 3.

FIG. 4 illustrates a cross-section taken from a location in the active region 16 of the die 12 to an edge, which in this embodiment is a corner, of the first die 12. As shown in FIG. 4, the wafer 10 includes a portion of the first die 12, which includes a substrate 144. As to not obfuscate, circuitry and elements known to a skilled artisan, such as transistors, are not illustrated in FIG. 4. Metal features or structures are formed over the substrate 144. Metal features 148, 150, 152, 154, and 156 are formed within a first interlayer dielectric layer 146, which can be any suitable dielectric material, such as a low dielectric constant material. Metal features 160, 162, 164, 166, and 168 are formed within a second interlayer dielectric layer 158, which can be any suitable dielectric material, such as a low dielectric constant material. Metal features 172, 174, 176, 178, 180 and 182 are formed within a third interlayer dielectric layer 170, which can be any suitable dielectric material, such as a low dielectric constant material. Metal features 186, 188, 190, 192, 194 and 196 are formed within a fourth interlayer dielectric layer 184, which can be any suitable dielectric material, such as a low dielectric constant material. Each metal structure, in the embodiment illustrated, includes vias under a conductive line. In one embodiment, the metal structure can be two layers with equal dimensions (e.g., a metal line instead of vias is formed as the lower layer of each metal structure).

Within the first die 12 is the active region 16, and the scribe region 24, which includes the crack arrest structure 110. The active region 16 includes active circuitry 142, the edge seal 20, and the crack stop 22. The active circuitry 142 includes the first metal feature 148, which is over a substrate 144; the second metal feature 160, which is over the first metal feature 148; the third metal feature 172, which is over the second metal feature 160; and the fourth metal feature 186, which is over the third metal feature 172. The edge seal 20 includes a first metal feature 150, which is over the substrate 144; a second metal feature 162, which is over the first metal feature 150; a third metal feature 174, which is over the second metal feature 162; and a fourth metal feature 188, which is over the third metal feature 174. The crack stop 22 includes a first metal feature 152, which is over the substrate 144; a second metal feature 164, which is over the first metal feature 152; a third metal feature 176, which is over the second metal feature 164; and a fourth metal feature, which is 190 over the third metal feature 176.

The crack arrest structure 110 includes a first crack arrest feature 118, a second crack arrest feature 120, and a third crack arrest feature 122. The first crack arrest feature 118 includes the first metal feature 154, which is over the substrate 144; the second metal feature 166, which is over the first metal feature 154; the third metal feature 178, which is over the second metal feature 166; and the fourth metal feature 192, which is over the third metal feature 178. The first crack arrest feature 118 is stair-stepped (i.e., the metal features are in a stair-step configuration) so that each metal structure is closer to the edge or in the embodiment illustrated the corner of the die 12, than any overlying structures. If the first crack arrest feature is stair-stepped then it can force a crack 200 to propagate up each layer and prevent the crack 200 from propagating into the active region 16 of the die 12, as illustrated in FIG. 4. If the crack 200 propagates as shown in FIG. 4, the portion of the die 12 that is to the right of the die 12 may break off the die 12. This breakage relieves stress and therefore, may prevent a crack from forming.

The first metal feature 154 is a first distance 202 from the edge, which may be a corner, of the die 12. The distance between a metal feature and another location as used herein is the distance from the closest edge (i.e., the outer edge) of the metal feature to that location. The second metal feature 166 is a second distance 204 from the edge. The second distance 204 is greater than the first distance 202. The third metal feature 178 is a third distance 206 from the edge. The third distance 206 is greater than the second distance 204. The fourth metal feature 192 is a fourth distance 208 from the edge. The fourth distance 208 is greater than the third distance 206. As illustrated, the first crack arrest feature 118 has four metal features; however, the first crack arrest features 118 may have any number of metal features, such as one or more. Furthermore, in the embodiment illustrated, each metal feature has less vias than the underlying metal feature. For example, the first metal features 154 has five vias, as illustrated, the second metal feature 166 has four vias, the third metal feature 178 has three vias, and the fourth metal feature 192 has two vias. The number of vias for each layer can vary; the number of vias in FIG. 4 is for illustrative purposes. However, the less vias the more prone the semiconductor device may be to delaminate in this area.

The second crack arrest feature 120 includes the first metal feature 180, which is over a second dielectric 158, and the second metal feature 194, which is over the first metal feature 180. The first metal feature 180 is a fifth distance 210 from the edge. The fifth distance 210 is less than the distances 202, 204, 206, and 208. The second metal feature 194 is a sixth distance 212 from the edge. The sixth distance 212 is less than the distances 202, 204, 206, and 208. In the embodiment illustrated, the sixth distance 212 is approximately equal to the fifth distance 210. However, the sixth distance 212 can be greater than or less than the fifth distance 210. In one embodiment, the second crack arrest feature 120 is stair-stepped so that the sixth distance 212 is greater than the fifth distance 210. As illustrated, the second crack arrest feature 120 has two metal features; however, the second crack arrest features 120 may have any number of metal features, such as one or more.

The third crack arrest feature 122 includes the first metal feature 156, which is over the substrate 144; the second metal feature 168, which is formed over the first metal feature 156; the third metal feature 182, which is over the second metal feature 168; and the fourth metal feature 196, which is over the third metal feature 182. The first metal feature 156 is a seventh distance 214 from the edge. The second metal feature 168 is an eighth distance 216 from the edge. The third metal feature 182 is a ninth distance 218 from the edge. The fourth metal feature 196 is a tenth distance 220 from the edge. The distances 214, 216, 218, and 220 are less than the distances 202, 204, 206, 208, 210, and 212. In the embodiment illustrated, the distances 214, 216, 218, and 220 are approximately equal. However, the distances 214, 216, 218, and 220 may be different. For example, the third crack arrest features 122 can be stair-stepped. As illustrated, the third crack arrest feature 122 has four metal features; however, the third crack arrest features 122 may have any number of metal features, such as one or more.

In some embodiments, the second crack arrest feature 120, the third crack arrest feature 122, or both are not present. In other embodiments, additional crack arrest features are present. In one embodiment, the crack arrest structures extend along the edges of the die and may also be present in or near the corner of the die. Furthermore, instead of a stair-step pattern, the different metal features of the crack arrest may be formed in a curved shape when viewing the crack arrest features in a cross-section. The curved shape will direct the crack so that it does not enter the active circuit area.

By now it should be appreciated that there has been provided a structure used to minimize or prevent delamination, especially when a low dielectric constant material is used for ILD layers, and a method of forming such structure. In one embodiment, a crack arrest structure includes curva-linear or polygonal shapes, wherein the shapes are concentrically oriented around a common center at or near at least one corner of the die. In one embodiment, the crack arrest features are located concentrically around a common center located at or near at least one corner of the die. In one embodiment, the die includes corner regions and a non-corner region, wherein the non-corner region is devoid of the crack arrest structure and at least one of the corner regions comprises the crack arrest structure. In one embodiment, the crack arrest structure includes metal feature that form a stair-step pattern to direct crack or delamination from a lower portion of the die to an upper portion of the die.

Although the invention is described herein with reference to specific embodiments, various modifications and changes can be made without departing from the scope of the present invention as set forth in the claims below. For example, metal features in FIG. 4 can be made of a material other than metal. In addition, saw region 40 may not be present. The crack arrest structures described can be used on die even if singulation is not performed with a saw. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

What is claimed is:

1. A semiconductor device comprising:
   a die comprising an active region and a die edge;
   the die further comprising a scribe region outside a crack stop, wherein the crack stop at least partially surrounds the active region; and
   the die further comprising a crack arrest structure, wherein at least a portion of the crack arrest structure is formed in the scribe region of the die, wherein the die further comprises:
      a substrate,
      a first layer overlying the substrate, wherein the first layer comprises metal,
      a second layer overlying the first layer, wherein the second layer comprises metal,
      a third layer overlying the second layer, wherein the third layer comprises metal, and
      wherein the crack arrest structure comprises:
         a first portion formed in the first layer, wherein the first portion has a first outer edge located at a first distance from the die edge;
         a second portion formed in the second layer, wherein the second portion has a second outer edge located at a second distance from the die edge and the second distance is greater than the first distance; and
         a third portion formed in the third layer, wherein the third portion has a third outer edge located at a third distance from the die edge, and wherein the third distance is greater than the second distance; and,
      wherein the crack arrest structure extends from a first edge of the scribe region to a second edge of the scribe region and spaced from a corner formed by the first and second edges of the scribe region.

2. The semiconductor device of claim 1 further comprising an edge seal, wherein the edge seal at least partially surrounds the active region.

3. The semiconductor device of claim 1, wherein the die further comprises corner regions and a non-corner region, wherein the non-corner region is devoid of the crack arrest structure and at least one of the corner regions comprises the crack arrest structure.

4. The semiconductor device of claim 3, wherein the crack arrest structure comprises curva-linear shapes, wherein the curva-linear shapes are oriented from a common center at or near at least one corner of the die.

5. The semiconductor device of claim 3, wherein the crack arrest structure comprises polygonal shapes, wherein the polygonal shapes are oriented from a common center at or near at least one corner of the die.

6. The semiconductor device of claim 1, wherein the die is formed on a semiconductor wafer, the semiconductor wafer comprises a saw region adjacent the die edge and wherein the crack arrest structure does not extend into the saw region.

7. The semiconductor device of claim 1, wherein the crack arrest structure further comprises a fourth portion formed in the first layer, wherein the fourth portion has a fourth outer edge located at a fourth distance from the die edge and the first distance is greater than the fourth distance.

8. The semiconductor device of claim 1, wherein the crack arrest structure further comprises:
  a fifth portion formed in the second layer, wherein the fifth portion has a fifth outer edge located at a fifth distance from the die edge, wherein the second distance is greater than the fifth distance; and
  a sixth portion formed in the third layer, wherein the sixth portion has a sixth outer edge located at a sixth distance from the die edge, wherein the third distance is greater than the sixth distance.

* * * * *